US007006376B2

(12) United States Patent
Kozicki

(10) Patent No.: US 7,006,376 B2
(45) Date of Patent: Feb. 28, 2006

(54) TUNABLE CANTILEVER APPARATUS AND METHOD FOR MAKING SAME

(75) Inventor: Michael N. Kozicki, Phoenix, AZ (US)

(73) Assignee: Axon Technologies Corporation, Scottsdale, AZ (US)

(*) Notice: Subject to any disclaimer, the term of this patent is extended or adjusted under 35 U.S.C. 154(b) by 209 days.

(21) Appl. No.: 10/282,902

(22) Filed: Oct. 28, 2002

(65) Prior Publication Data

US 2003/0210564 A1 Nov. 13, 2003

Related U.S. Application Data

(60) Provisional application No. 60/339,604, filed on Oct. 26, 2001.

(51) Int. Cl.
*G11C 16/04* (2006.01)

(52) U.S. Cl. .................... 365/185.01; 365/153; 257/2; 257/4

(58) Field of Classification Search ................ 365/153, 365/185.01; 257/2, 3, 4
See application file for complete search history.

(56) References Cited

U.S. PATENT DOCUMENTS 6,263,736 B1 7/2001 Thundat et al.
6,487,106 B1 * 11/2002 Kozicki ...................... 365/153
6,646,902 B1 * 11/2003 Gilton et al. ............... 365/100

FOREIGN PATENT DOCUMENTS

WO WO 97 48032 A 12/1997

OTHER PUBLICATIONS

Chen G Y et al: "Adsorption-induced surface stress and its effects on resonance frequency of microcantilevers", Journal of Applied Physics, vol. 77, No. 8, Apr. 15, 1995, pp. 3618-3622, XP002101782, ISSN: 0021-8979.

* cited by examiner

*Primary Examiner*—Anh Phung
*Assistant Examiner*—Pho M. Luu
(74) *Attorney, Agent, or Firm*—Snell & Wilmer, LLP

(57) ABSTRACT

Mass distribution within programmable surface control devices is controlled growing or dissolving an electrodeposition of metal and/or metal ions from a solid solution upon application of a suitable electric field. One such programmable surface control device includes a tunable cantilever assembly whose resonant frequency is changed by depositing and dissolving an electrodeposit on a surface of the assembly using an electric field.

11 Claims, 2 Drawing Sheets

TUNABLE CANTILEVER APPARATUS AND METHOD FOR MAKING SAME

CROSS-REFERENCE TO RELATED APPLICATIONS

This application claims the benefit of U.S. Provisional Application Ser. No. 60/339,604, filed Oct. 26, 2001, which is herein incorporated by reference.

FIELD OF INVENTION

The present invention generally relates to programmable surface control devices, and more particularly to a tunable cantilever assembly and method of making the same.

BACKGROUND OF THE INVENTION

Programmable Metallization Cell (PMC) technology is generally based on the electrodeposition of metal and/or metal ions from a solid solution upon application of a suitable field. The programmable metallization cell disclosed in U.S. patent application Ser. No. 09/502,915, filed Feb. 11, 2000, which is herein incorporated by reference, is a simple structure that operates very effectively as a non-volatile memory device. The mechanism for the memory device utilizes a thin amorphous material with two metal contacts where the amorphous material can incorporate relatively large amounts of metal to behave as a solid electrolyte. Under certain bias conditions, the metal ions in the electrolyte are reduced to form an electrodeposit that acts as a conducting link between the metal contacts (electrodes). As a result, the resistance of the device can be greatly decreased. In addition, applying a reverse bias will cause the electrodeposit to disperse and return the device to a state of high resistance.

Formation or dissolution of an electrodeposit on a microelectronic structure or device changes the surface characteristics of the device thereby enabling one to manipulate or control the surface of the device. Moreover, since the ability to increase applications of a device depends on the ability to manipulate or control the device, there is a need for devices which already possess the ability to control surface characteristics and mass distributions of the devices by simply applying electrical means to the devices.

SUMMARY OF THE INVENTION

The present invention is directed to surface structures of microdevices whose physical and electrical features can be manipulated by applying an electrical means to the structures in order to control the surface characteristics and mass distribution of such devices. Applying an electrical means to microdevice structures having certain compositions will cause the electrodeposition of electrodissolution of an electrodeposit which can significantly alter the surface characteristics and mass distribution of the microdevice.

In accordance with one exemplary embodiment of the present invention, a programmable surface control device includes a solid electrolyte solution layer containing a conductive material, and a pair of electrodes on the surface of the electrolyte solution layer with one of the electrodes having the same type of conductive material as the electrolyte solution layer. In accordance with one aspect of this exemplary embodiment, the electrolyte solution layer is a chalcogenide glass with a dissolved metal such as silver, copper, and zinc. Exemplary chalcogenide glasses with dissolved metal in accordance with the invention include solid solutions of $As_xS_{1-x}$—Ag, $Ge_xSe_{1-x}$—Ag, $Ge_xS_{1-x}$—Ag, $As_xS_{1-x}$—Cu, $Ge_xSe_{1-x}$—Cu, $GeS_{1-x}$—Cu, combinations of these materials, and the like. In accordance with another aspect of this embodiment, an electrodeposit is present on the surface of the solid electrolyte solution layer extending between the pair of electrodes. The electrodeposit causes the surface of the solid electrolyte solution layer to become hydrophobic and can also cause an increase in friction of the surface layer.

In accordance with another exemplary embodiment of the present invention, a programmable surface control device like that described above is used to fabricate a tunable cantilever assembly by incorporating the programmable surface control device into a cantilever arm. In accordance with one aspect of the tunable cantilever assembly, the cantilever arm has a conducting cantilever tip at one end and is mounted to a dielectric layer at its opposite end. A solid electrolyte solution layer overlies the cantilever arm but is isolated from the cantilever arm, except for its tip, by a dielectric layer. A sacrificial electrode is disposed on the solid electrolyte solution layer near the end of the cantilever opposite the conducting cantilever tip. When a sufficient bias is applied between the sacrificial electrode and the conducting cantilever tip, metal ions from the sacrificial electrode dissolve into the electrolyte solution layer and form an electrodeposit on the cantilever arm proximate to the end having the cantilever tip thereby redistributing the mass of the cantilever assembly.

The present invention is also directed to a method for making a programmable surface control device which includes the steps of forming a solid electrolyte solution layer containing a conductive material and forming a pair of electrodes on the surface of the solid electrolyte solution layer where one electrode includes the same type of conductive material as the solid electrolyte solution layer. The programmable surface control device is controlled by applying a voltage between the pair of electrodes to create or dissolve an electrodeposit which, as a result, changes the surface characteristics and mass distributions of the device. In one aspect of this exemplary method of the invention, an electrodeposit is created which alters the surface tension of the solid electrolyte solution layer thereby increasing the contact angle of the electrodeposit with the solution layer and making the solution layer more hydrophobic. In another aspect of this exemplary method, the electrodeposit increases the friction of the surface of the solid electrolyte solution layer.

In another exemplary embodiment of the present invention, a method for making a tunable cantilever assembly is presented which includes forming a solid electrolyte solution layer containing a conductive material and forming a pair of electrodes on a surface of the solid electrolyte solution layer wherein one of the electrodes includes the same conductive material as the solution layer, the solution layer and electrodes being formed within the structure of a cantilever assembly; and applying a bias to the electrodes at a magnitude sufficient to change a mass distribution of the cantilever assembly.

BRIEF DESCRIPTION OF THE DRAWINGS

A more complete understanding of the present invention may be derived by referring to the detailed description and claims, considered in connection with the figures, wherein like reference numerals refer to similar elements throughout the figures, and:

DETAILED DESCRIPTION

The present invention generally relates to PMC technology which is based on the electrodeposition of metal and/or metal ions from a solid solution upon application of a suitable electric field. More specifically, the present invention relates to programmable surface control devices whose physical features, such as surface characteristics and mass distribution, are controlled by the presence or absence of a metallic electrodeposit upon application of a bias.

Figure 1:
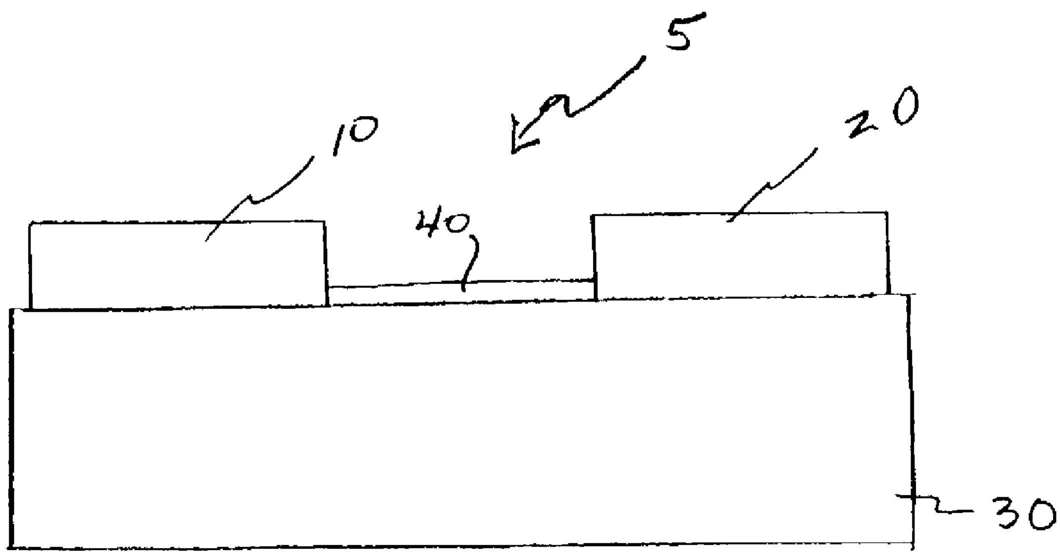
FIG. 1 is a cross-sectional illustration of an exemplary embodiment of a programmable surface control device in accordance with the present invention.

FIG. 1 illustrates a cross-sectional view of an exemplary embodiment of a programmable surface control device 5 in accordance with the present invention. Device 5 includes electrodes 10 and 20 formed on a surface of a layer of a solid electrolyte solution 30. Solid electrolyte solution layer 30 is formed from a material that conducts ions upon application of a sufficient voltage. Suitable materials for solid electrolyte solution layer 30 include chalcogenide glasses with dissolved conductive materials, such as dissolved metals and/or metal ions. The concentration of the metal in the chalcogenide glasses is typically on the order of many tens of atomic percent. In accordance with the present invention, exemplary chalcogenide glasses with dissolved metal include solid solutions of $As_xS_{1-x}$—Ag, $Ge_xSe_{1-x}$—Ag, $Ge_xS_{1-x}$—Ag, $As_xS_{1-x}$—Cu, $Ge_xSe_{1-x}$—Cu, $Ge_xS_{1-x}$—Cu, other chalcogenide materials which include silver, copper, or zinc, combinations of these materials, and the like.

Electrodes 10 and 20 include an anode having an oxidizable form of the metal dissolved in the chalcogenide glass and an inert cathode. When a voltage is applied between electrodes 10 and 20, the positively charged metal ions will migrate toward the cathode region. Once a sufficient bias is applied, the metal ions will form a stable metallic electrodeposit 40 that may extend across the surface of the solid electrolyte solution layer 30 from the cathode to the anode. The magnitude of the sufficiently bias will depend upon the materials used, the series resistances involved, and the geometry of the device. The applied bias is typically within a range of about 200 mV to 20V, but it will be appreciated by those skilled in the art that any bias suitable for forming stable metallic electrodeposit 40 may be used. The morphology of the resulting metallic electrodeposit will depend, in part, on the applied bias and on the total charge of the metal ions that are deposited.

Metallic electrodeposit 40 can significantly alter the surface characteristics and mass distribution of programmable surface control device 5. In one exemplary embodiment of the present invention, electrodeposit 40 may increase the contact angle of the surface of solid electrolyte solution layer 30 thereby resulting in a more hydrophobic surface. For example, silver electrodeposition on the surface of a programmable surface control device in which silver is dissolved in a germanium selenide glass may alter the surface tension of the surface of the glass so that the contact angle may increase by 30 degrees or more, making the surface of the glass significantly more hydrophobic. In another exemplary embodiment of the present invention, the presence of the electrodeposit may increase the friction of the surface of the glass. Reversing the applied bias will cause the electrodissolution of the electrodeposit, thereby returning the programmable surface control device to its original surface state. In a further exemplary embodiment of the present invention, metal ions can be manipulated towards either the cathode or the anode by supplying a sufficient bias to the programmable surface control device. Accordingly, mass distribution within the programmable surface control device can be controlled.

Figure 2:
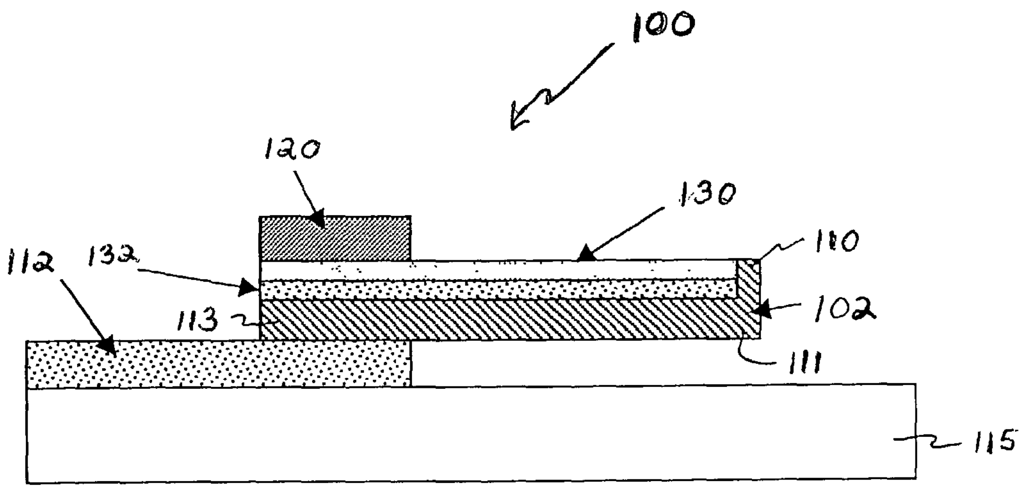
FIG. 2 is a cross-sectional illustration of another exemplary embodiment of a programmable surface control device in accordance with the present invention which includes a tunable cantilever assembly.

In another exemplary embodiment of the invention, the programmable surface control technology of the present invention is used to fabricate tunable cantilever assemblies. FIG. 2 illustrates an exemplary embodiment of a tunable cantilever assembly 100 in accordance with the present invention.

Cantilever assembly 100 includes a cantilever arm 102 that is mounted to a dielectric layer 112 at one end 113 of cantilever arm 102 and a conducting cantilever arm tip 110 positioned at an opposite end 111 of cantilever arm 102. Dielectric layer 112 is mounted to a substrate 115. Cantilever assembly 100 further includes a solid electrolyte solution layer 130 which overlies cantilever arm 102, and which is electrically isolated from cantilever arm 102 by another dielectric layer 132 with the exception of conducting cantilever arm tip 110 which comes into electrical contact with solid electrolyte solution layer 130. Cantilever assembly 100 also includes a sacrificial electrode 120 disposed on solid electrolyte solution layer 130 remote from conducting cantilever arm tip 110 and near end 113 of cantilever arm 102.

Solid electrolyte solution layer 130 is preferably formed from a chalcogenide glass containing dissolved conductive materials, such as dissolved metals and/or metal ions. Exemplary chalcogenide glasses having a dissolved metal include solid solutions of $As_xS_{1-x}$—Ag, $Ge_xSe_{1-x}$—Ag, $Ge_xS_{1-x}$—Ag, $As_xS_{1-x}$—Cu, $Ge_xSe_{1-x}$—Cu, $Ge_xS_{1-x}$—Cu, other chalcogenide materials which include silver, copper, or zinc, combinations of these materials, and the like. Sacrificial electrode 120 is preferably formed of an oxidizable form of the metal dissolved in solid electrolyte solution layer 130. For example, in one aspect of the invention, solid electrolyte solution layer 130 may comprise silver dissolved in a germanium selenide glass and sacrificial electrode 120 may include an oxidizable form of silver.

Figure 3:
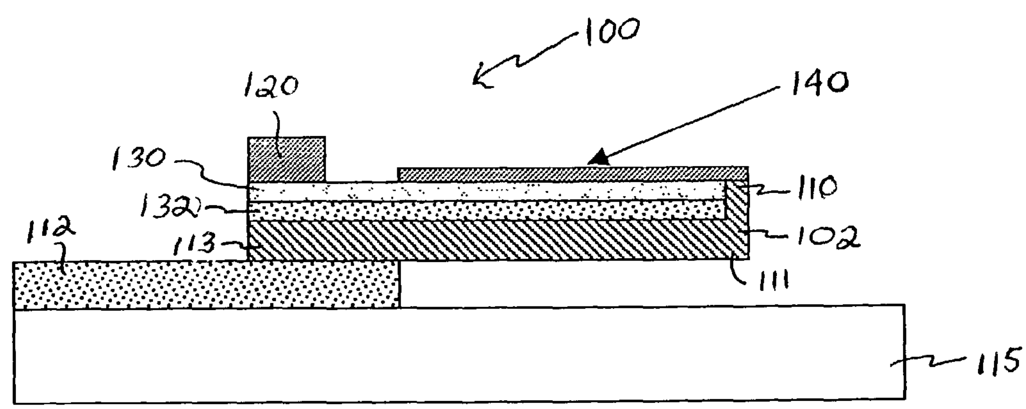
FIG. 3 is a cross-sectional illustration of the tunable cantilever assembly in FIG. 2 shown with a bias applied between the sacrificial electrode and the conducting cantilever arm tip.

Application of a bias between sacrificial electrode 120 and conducting cantilever arm tip 110 is shown in FIG. 3. When a sufficient bias, preferably greater than about 100 mV, is applied between sacrificial electrode 120 and conducting cantilever arm tip 110 so that sacrificial electrode 120 is positive relative to conducting cantilever tip 110, metal ions from sacrificial electrode 120 dissolve into solid electrolyte solution layer 130 and form an electrodeposit 140 on cantilever arm 102. Electrodeposit 140 is formed on cantilever arm 102 proximate to end 111 of cantilever arm 102 such that it overlies conducting cantilever arm tip 110. Accordingly, the metal ions are effectively redistributed along the length of cantilever arm 102 from sacrificial anode 120 to conducting cantilever arm tip 110 thereby redistributing the mass of cantilever assembly 100. The resulting mass redistribution of cantilever assembly 100 lowers the resonant frequency of cantilever assembly 100.

The resonant frequency of cantilever assembly 100 can then be increased by applying a sufficient reverse bias between sacrificial electrode 120 and conducting cantilever arm tip 110. Applying a sufficient reverse bias between sacrificial electrode 120 and conducting cantilever arm tip 110 will dissolve electrodeposit 140 and cause the metal ions of electrodeposit 140 to move back into solid electrolyte solution layer 130, and then migrate back into sacrificial anode 120. Accordingly, the resonant frequency of cantilever assembly 100 can in effect be tuned by applying a suitable bias or reverse bias between sacrificial electrode 120 and conducting cantilever arm tip 110.

The above described tunable cantilever assembly embodiment of the present invention may be used in a growing number of microelectromechanical systems (MEMS) applications in which the control of resonant frequency is critical. Such applications include "rf MEMS" which utilize high Q mechanical resonators which may be vibrating cantilevers, rather than electrical oscillators. Further, the above-described programmable surface control technology could be used for fine-tuning systems or for controlling changes in resonance over a narrow range of frequencies. The redistribution of mass and the additional change in stiffness of the cantilever due to surface electrodeposition may also be useful in applications where the inertia of a "proof of mass" at the end of a cantilever is used to deflect the cantilever arm during acceleration/deceleration.

Although the present invention is set forth herein in the context of the appended drawing figures, it should be appreciated that the invention is not limited to the specific form shown. For example, while the programmable surface control structure is conveniently described above in connection with tuning the resonant frequency of cantilever assemblies, the invention is not so limited. For example, the structure of the present invention may be suitably employed to electrically fine tune deflection in accelerometer systems. Various other modifications, variations, and enhancements in the design and arrangement of the method and devices set forth herein may be made without departing from the present invention as set forth in the appended claims.

I claim:

1. A programmable surface control device comprising a solid electrolyte solution layer containing a conductive material and a pair of electrodes with one electrode including a form of the conductive material, said solid electrolyte solution layer and said electrodes being configured relative to one another to enable altering a mass distribution of the device; wherein the solid electrolyte solution layer and electrodes are incorporated within a cantilever arm.

2. The programmable surface control device of claim 1 wherein said solid electrolyte solution layer comprises a chalcogenide glass and said conductive material comprises a metal dissolved within said chalcogenide glass.

3. The programmable surface control device of claim 2, wherein said metal is selected from the group consisting of silver, copper, and zinc.

4. The programmable surface control device of claim 2, wherein said chalcogenide glass is selected from the group consisting of $As_xS_{1-x}$, $Ge_xS_{1-x}$ and $Ge_xSe_{1-x}$.

5. The programmable surface control device of claim 2 further comprising a metallic electrodeposit disposed on a surface of said solid electrolyte solution layer.

6. The programmable surface control device of claim 1 wherein said cantilever arm is mounted on a dielectric layer at one end and comprises a conducting cantilever arm tip at an opposite end.

7. The programmable surface control device of claim 6 wherein said solid electrolyte solution layer overlies said cantilever arm and is separated from said cantilever arm by a second dielectric layer except at the conducting cantilever arm tip.

8. The programmable surface control device of claim 7 wherein said pair of electrodes comprise a sacrificial electrode disposed on a surface of the solid electrolyte solution layer and the conducting cantilever arm tip which is in contact with the solid electrolyte solution layer.

9. The programmable surface control device of claim 8 further comprising an electrodeposit on the surface of said solid electrolyte solution layer which comprises conductive material removed from said sacrificial electrode.

10. A method of distributing a mass of the programmable surface control device of claim 1 comprising applying a bias across the pair of electrodes to add mass to the electrolyte solution layer.

11. A method of distributing a mass of the programmable surface control device of claim 1 comprising applying a bias across the pair of electrodes to remove mass from the electrolyte solution layer.

* * * * *